United States Patent
Tsukui et al.

(10) Patent No.: US 10,791,650 B2
(45) Date of Patent: Sep. 29, 2020

(54) COOLING DEVICE

(71) Applicants: KEIHIN CORPORATION, Tokyo (JP); TOHOKU UNIVERSITY, Sendai-shi (JP)

(72) Inventors: Hajime Tsukui, Kakuda (JP); Yusuke Nishimura, Kakuda (JP); Takuya Ouchi, Kakuda (JP); Shigenao Maruyama, Sendai (JP); Atsuki Komiya, Sendai (JP); Junnosuke Okajima, Sendai (JP)

(73) Assignees: KEIHIN CORPORATION, Tokyo (JP); TOHOKU UNIVERSITY, Sendai-Shi (JP)

( * ) Notice: Subject to any disclaimer, the term of this patent is extended or adjusted under 35 U.S.C. 154(b) by 0 days.

(21) Appl. No.: 16/364,639

(22) Filed: Mar. 26, 2019

(65) Prior Publication Data
US 2019/0307021 A1    Oct. 3, 2019

(30) Foreign Application Priority Data
Mar. 30, 2018 (JP) ................. 2018-069868

(51) Int. Cl.
*H05K 7/20* (2006.01)

(52) U.S. Cl.
CPC ..... *H05K 7/20309* (2013.01); *H05K 7/20318* (2013.01)

(58) Field of Classification Search
CPC .......... H05K 7/20218–20272; H05K 7/20309–20372; H05K 7/20627–30663; H05K 7/20763–208; H05K 7/20881; H05K 7/20936; H05K 7/2099; G06F 1/20; H01L 23/473; F28F 23/00
USPC .............. 361/679.47, 679.53, 699, 701–703; 165/80.4–80.5, 104.33; 257/714
See application file for complete search history.

(56) References Cited

U.S. PATENT DOCUMENTS

| 4,612,978 A | * | 9/1986 | Cutchaw | H01L 23/433 165/104.33 |
| 5,183,104 A | * | 2/1993 | Novotny | H01L 23/467 165/104.33 |
| 5,268,812 A | * | 12/1993 | Conte | F28D 15/0233 361/698 |

(Continued)

FOREIGN PATENT DOCUMENTS

JP        05003274 A    1/1993

*Primary Examiner* — Daniel P Wicklund
*Assistant Examiner* — Amir A Jalali
(74) *Attorney, Agent, or Firm* — Cantor Colburn LLP

(57) ABSTRACT

A cooling device includes a heat receiver that receives heat of an electronic component via a coolant, a heat discharger that discharges heat of the coolant from the heat receiver, and a circulation flow path through which the coolant flows from the heat receiver to the heat discharger and the coolant flows from the heat discharger to the heat receiver. The heat receiver is provided with an attachment surface to which a plurality of the electronic components are attached, a first flow path that communicates with the circulation flow path, and a plurality of surface area increasing members that communicate with the first flow path and that are provided on a rear surface of the attachment surface corresponding to the plurality of electronic components.

5 Claims, 2 Drawing Sheets

(56) References Cited

U.S. PATENT DOCUMENTS

| | | | | |
|---|---|---|---|---|
| 6,166,907 | A * | 12/2000 | Chien | F28D 1/0478 |
| | | | | 165/104.33 |
| 6,975,028 | B1 * | 12/2005 | Wayburn | F28D 15/0266 |
| | | | | 257/712 |
| 7,215,545 | B1 * | 5/2007 | Moghaddam | H01L 23/3732 |
| | | | | 165/185 |
| 2004/0182088 | A1 * | 9/2004 | Ghoshal | H01L 23/473 |
| | | | | 62/3.7 |
| 2009/0133866 | A1 * | 5/2009 | Campbell | G06F 1/20 |
| | | | | 165/288 |
| 2012/0268877 | A1 * | 10/2012 | Rice | F25B 21/02 |
| | | | | 361/679.4 |
| 2016/0123637 | A1 * | 5/2016 | Moreno | F25B 39/02 |
| | | | | 62/516 |
| 2016/0183409 | A1 * | 6/2016 | Zhou | H05K 7/20927 |
| | | | | 361/699 |
| 2016/0330873 | A1 * | 11/2016 | Farshchian | G06F 1/20 |
| 2017/0127564 | A1 * | 5/2017 | So | H05K 7/20136 |
| 2017/0156240 | A1 * | 6/2017 | Silvennoinen | H05K 7/20936 |
| 2017/0227296 | A1 * | 8/2017 | Mohaupt | F28F 21/04 |
| 2018/0307283 | A1 * | 10/2018 | Dupont | G06F 1/203 |

* cited by examiner

US 10,791,650 B2

COOLING DEVICE

CROSS-REFERENCE TO RELATED APPLICATION

The present invention claims priority under 35 U.S.C. § 119 to Japanese Patent Application No. 2018-069868, filed Mar. 30, 2018, the contents of which are hereby incorporated herein by reference in their entirety.

BACKGROUND OF THE INVENTION

Field of the Invention

The present invention relates to a cooling device for an electronic component.

Description of Related Art

Since a plurality of electronic components generating a large amount of heat are used for a power module that is installed in a vehicle or the like, the power module is provided with a cooling device that cools the electronic components. For example, Japanese Unexamined Patent Application, First Publication No. H5-3274 discloses a cooling device that cools a plurality of electronic components.

The cooling device in Japanese Unexamined Patent Application, First Publication No. H5-3274 is provided with a plurality of tubes from which liquid coolants are respectively ejected toward the plurality of electronic components, a partition member provided to surround each of the electronic components, and a discharge flow path through which the liquid coolants after cooling flow. The liquid coolants ejected from the tubes radially flow on flat surfaces of the electronic components in a space partitioned by the partition member and cool the electronic components. After cooling the electronic components, the liquid coolants are discharged toward the discharge flow path since a direction in which the liquid coolants flow is changed by the partition member.

SUMMARY OF THE INVENTION

In the case of the cooling device in Japanese Unexamined Patent Application, First Publication No. H5-3274, the liquid coolants after the cooling of the electronic components are mixed with each other in the discharge flow path. Since the liquid coolant before the cooling which is ejected from the tubes and the liquid coolant after the cooling are separated from each other only by the separation member, the liquid coolant after the cooling may flow over the separation member and may be mixed with the liquid coolant before the cooling. As a result, there is a possibility of a decrease in electronic component cooling efficiency.

The present invention has been made in consideration of the above-described circumstances and an object thereof is to provide a cooling device that can efficiently cool a plurality of electronic components.

In order to achieve the above-described object, the present invention adopts the following aspects.

(1) That is, a cooling device according to an aspect of the present invention includes a heat receiver that receives heat of an electronic component via a coolant, a heat discharger that discharges heat of the coolant from the heat receiver, and a circulation flow path through which the coolant flows from the heat receiver to the heat discharger and the coolant flows from the heat discharger to the heat receiver. The heat receiver is provided with an attachment surface to which a plurality of the electronic components are attached, a first flow path that communicates with the circulation flow path, and a plurality of surface area increasing members that communicate with the first flow path and that are provided on a rear surface of the attachment surface corresponding to the plurality of electronic components.

(2) In the cooling device according to (1), the heat receiver may be an evaporator that evaporates the coolant in a liquid state by using the heat of the electronic component, the heat discharger may be a condenser that condenses coolant vapor generated in the evaporator to reproduce a liquid coolant, and the evaporator may be provided in a vertical posture.

(3) In the cooling device according to (2), the plurality of electronic components may be attached to the attachment surface such that the electronic components are arranged in a horizontal direction, and the first flow path may extend in the horizontal direction.

(4) In the cooling device according to (3), the plurality of electronic components arranged in the horizontal direction may be attached to the attachment surface in a plurality of rows in a vertical direction, and the first flow path may be provided for each of the rows of electronic components.

(5) In the cooling device according to (4), the first flow path positioned on an upper side from among the first flow paths respectively provided for the rows of electronic components may be provided with a vapor passage portion through which the coolant vapor generated on a lower side flows upward.

With the cooling device according to the above-described aspects of the present invention, it is possible to efficiently cool a plurality of electronic components.

DETAILED DESCRIPTION OF THE INVENTION

Hereinafter, a cooling device 1 according to an embodiment of the present invention will be described with reference to FIG. 1 to FIG. 3. The cooling device 1 is used to cool electronic components E. Each electronic component E is, for example, a power semiconductor element of a power control unit (PCU) that is installed in a vehicle such as a hybrid vehicle or an electric vehicle, which travels by using a motor (electric motor) as a power source.

Figure 1:
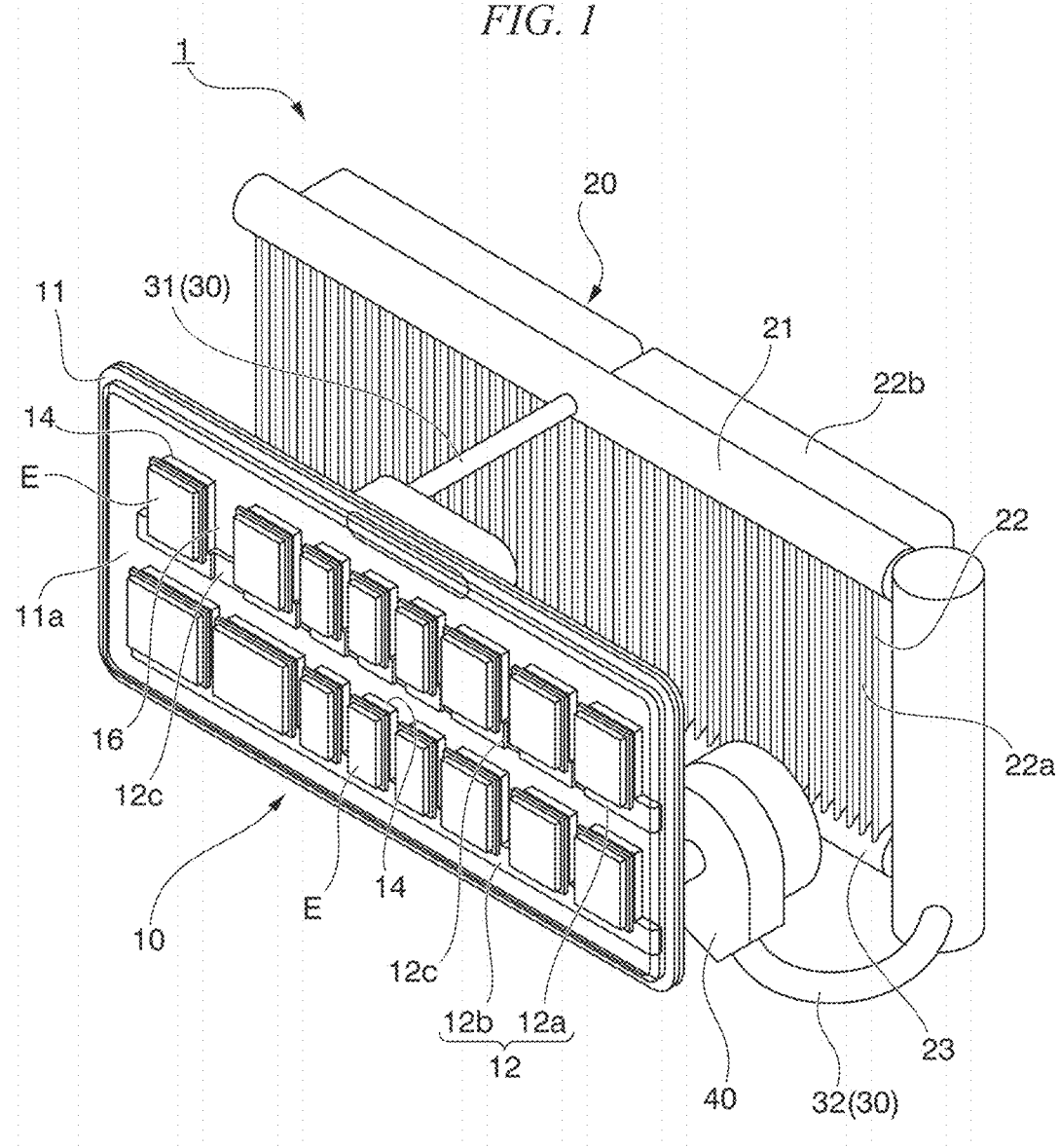
FIG. 1 is a perspective view of a cooling device according to an embodiment of the present invention.

As illustrated in FIG. 1, the cooling device 1 is provided with an evaporator 10 (heat receiver), a condenser 20 (heat discharger), a circulation flow path 30, and a pump 40. The evaporator 10 receives heat of the electronic components E via a coolant. The evaporator 10 evaporates the coolant in a liquid state by using the heat of the electronic components E. The condenser 20 discharges the heat of the coolant sent from the evaporator 10. The condenser 20 condenses coolant vapor generated in the evaporator 10 to reproduce a liquid coolant. The circulation flow path 30 includes a first pipe 31 through which the coolant vapor flows from the evaporator 10 to the condenser 20, and a second pipe 32 through which the liquid coolant flows from the condenser 20 to the evaporator 10. The pump 40 applies a flowing force to the liquid coolant.

Figure 2:
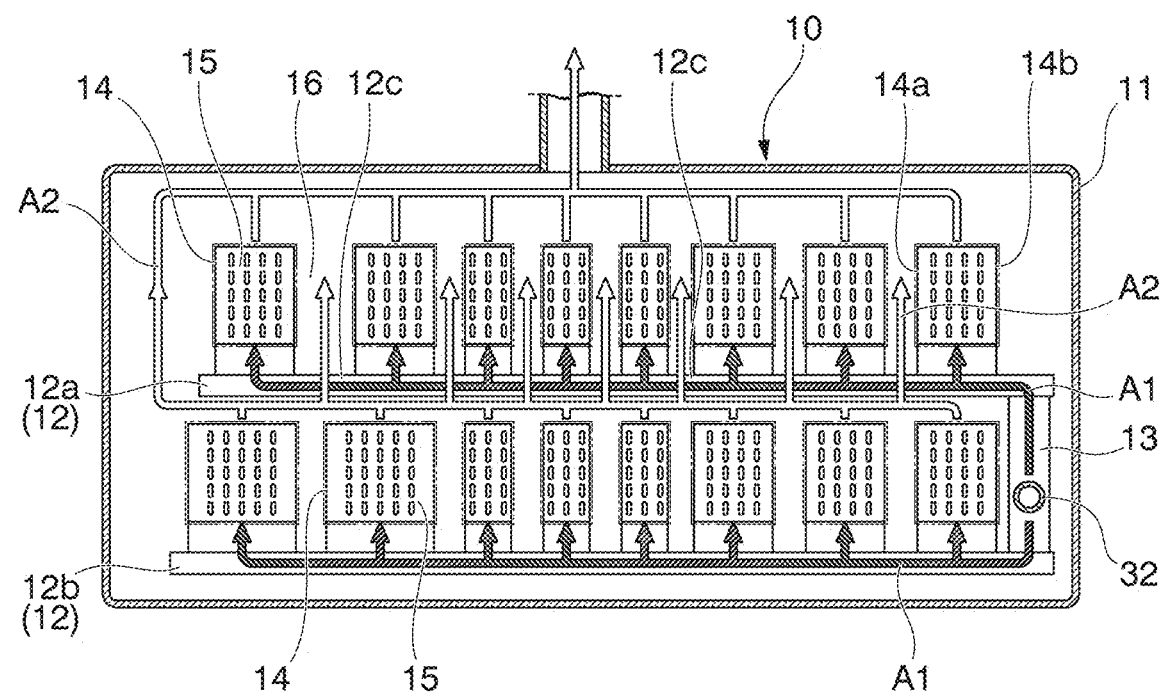
FIG. 2 is a longitudinal sectional view of an evaporator of the cooling device.
Figure 3:
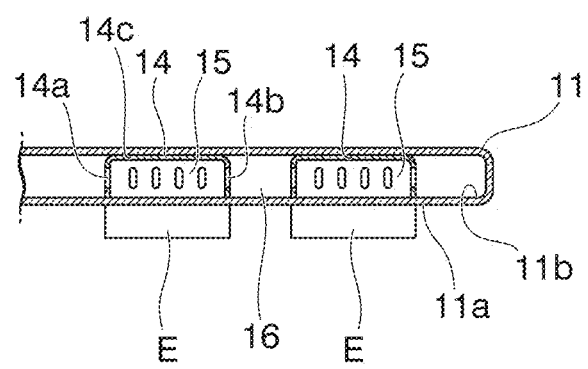
FIG. 3 is an enlarged cross sectional view of the evaporator of the cooling device.

As illustrated in FIG. 1 and FIG. 2, the evaporator 10 is provided with a housing 11, first flow paths 12, a second flow path 13, a plurality of liquid reservoirs 14, and a plurality of surface area increasing members 15. The evaporator 10 is provided in a vertical posture.

The housing 11 has an approximately rectangular parallelepiped-like shape. The housing 11 is provided in a vertical posture and is provided with an attachment surface 11a to which the plurality of electronic components E are attached. The attachment surface 11a is an outer surface of the housing 11. That is, the plurality of electronic components E are disposed on the attachment surface 11a while being in a vertical posture. The plurality of electronic components E are disposed such that a plurality of (in the present embodiment, two) rows of electronic components E are arranged in a vertical direction, each row consisting of a plurality of (in the present embodiment, eight) electronic components E arranged in a horizontal direction.

One end of the first pipe 31 is connected to an upper portion of the housing 11.

The first flow paths 12 are provided in the housing 11. As illustrated in FIG. 2, the first flow paths 12 include an upper flow path 12a positioned on an upper side, and a lower flow path 12b positioned on a lower side. The upper flow path 12a extends in the horizontal direction at a position below the electronic components E positioned on an upper side. The lower flow path 12b extends in the horizontal direction at a position below the electronic components E positioned on a lower side.

As illustrated in FIG. 1, the upper flow path 12a is provided with a plurality of grooves (vapor passage portions) 12c through which the coolant vapor generated in the liquid reservoirs 14, which are positioned on the lower side from among the liquid reservoirs 14, flows upward. The plurality of grooves 12c are provided to respectively communicate with gaps 16 between the liquid reservoirs 14, which are positioned on the upper side from among the liquid reservoirs 14.

The second flow path 13 connects the upper flow path 12a and the lower flow path 12b to each other. One end of the second pipe 32 is connected to the second flow path 13. Therefore, the first flow paths 12 communicate with the second pipe 32 via the second flow path 13.

The plurality of liquid reservoirs 14 are provided in the housing 11. The plurality of liquid reservoirs 14 communicate with the first flow paths 12 and liquid coolants are stored therein. As illustrated in FIG. 2 and FIG. 3, the plurality of liquid reservoirs 14 are provided on a rear surface 11b of the attachment surface 11a corresponding to the plurality of electronic components E. The rear surface 11b is an inner surface of the housing 11. The liquid reservoirs 14 are disposed to face the electronic components E with the attachment surface 11a interposed therebetween. That is, the plurality of liquid reservoirs 14 are disposed such that a plurality of (in the present embodiment, two) rows of liquid reservoirs 14 are arranged in the vertical direction, each row consisting of a plurality of (in the present embodiment, eight) liquid reservoirs 14 arranged in the horizontal direction.

Each of the liquid reservoirs 14 is provided with a pair of side surfaces 14a and 14b and a bottom surface 14c.

The pair of side surfaces 14a and 14b is attached to the rear surface 11b. The pair of side surfaces 14a and 14b extends in the vertical direction and a direction orthogonal to the rear surface 11b.

The bottom surface 14c connects the pair of side surfaces 14a and 14b to each other. The bottom surface 14c extends to be parallel to the rear surface 11b. The bottom surface 14c abuts onto the housing 11.

The liquid reservoirs 14 communicate with the first flow paths 12. The first flow paths 12 and the liquid reservoirs 14 may be integrally formed with each other such that the first flow paths 12 and the liquid reservoirs 14 communicate with each other, and the first flow paths 12 and the liquid reservoirs 14 may be separately formed such that the first flow paths 12 and the liquid reservoirs 14 are connected to each other.

The liquid reservoirs 14 and the rear surface 11b form approximately rectangular parallelepiped-like containers that are open upward. The liquid coolants are stored in the containers.

In a plan view, the bottom surface 14c has substantially the same shape as the electronic component E. In addition, in a plan view, the pair of side surfaces 14a and 14b is provided to surround the electronic component E. The liquid coolant is supplied such that a liquid surface of the liquid coolant stored in the liquid reservoir 14 reaches a position above an upper end of the electronic component E. Accordingly, in a plan view, the liquid coolant stored in the liquid reservoir 14 covers the entire electronic component E.

In each liquid reservoir 14, the surface area increasing member 15 is provided. That is, the plurality of surface area increasing members 15 are provided on the rear surface 11b of the attachment surface 11a corresponding to the plurality of electronic components E. Each surface area increasing member 15 is sintered material or the like in which a microchannel having a fine path therein is formed or in which a plurality of holes are formed. In a case where the microchannel is formed in each surface area increasing member 15, the sectional shape of the fine path may be circular, rectangular, or triangular. In addition, the fine path may be formed such that the sectional area thereof is constant in a path direction and may be formed to have a tapered shape such that the sectional area thereof changes. In addition, an inner wall of the fine path may be configured to have a function of prompting heat transmission by adjusting the roughness, the wettability, or the like. Any one of the above-described shapes may be selected as the shape of the surface area increasing members 15. It is preferable that each surface area increasing member 15 is provided in a state of being in contact with the rear surface 11b, the pair of side surfaces 14a and 14b, and the bottom surface 14c. Accordingly, it is possible to make the liquid coolant likely to be concentrated inside the surface area increasing member 15.

As illustrated in FIG. 1, the condenser 20 is provided with a vapor pipe 21, a heat discharging portion 22, and a condensing pipe 23.

The vapor pipe 21 is provided in an upper portion of the condenser 20 and extends in the horizontal direction. The vapor pipe 21 is connected to the other end of the first pipe 31.

The heat discharging portion 22 is provided with a plurality of fine pipes 22a extending in the vertical direction and a fan 22b provided on rear surfaces of the fine pipes 22a. The fine pipes 22a are connected to the vapor pipe 21. The condensing pipe 23 is provided in a lower portion of the condenser 20 and extends in the horizontal direction.

The condensing pipe 23 is connected to the fine pipes 22a. In addition, the condensing pipe 23 is connected to the other end of the second pipe 32.

The first pipe 31 connects a downstream side of the evaporator 10 and an upstream side of the condenser 20 to each other.

The second pipe 32 connects a downstream side of the condenser 20 and an upstream side of the evaporator 10 to each other.

An intermediate portion of the second pipe 32 is provided with the pump 40. The pump 40 causes a liquid coolant discharged from the condenser 20 to flow toward the evaporator 10.

Next, an operation of the cooling device 1 will be described in detail.

As illustrated by an arrow A1 in FIG. 2, when the pump 40 is driven, the liquid coolants are supplied from the condenser 20 to the upper flow path 12a and the lower flow path 12b of the first flow paths 12 through the second pipe 32 and the second flow path 13. The liquid coolants flow through the upper flow path 12a and the lower flow path 12b and are supplied to the liquid reservoirs 14.

By the liquid coolant stored in the liquid reservoir 14, the corresponding electronic component E is cooled. Specifically, the heat of the electronic component E is transmitted to the housing 11. The liquid coolant receives the heat of the housing 11 via the surface area increasing member 15 and changes into coolant vapor. That is, the liquid coolant receives the heat of the housing 11 (electronic component E) via the surface area increasing member 15 and cools the housing 11 (electronic component E) when the state thereof is changed from a liquid state to a gaseous state. As described above, the electronic component E is cooled through indirect heat exchange between the electronic component E and the liquid coolant which is performed via the housing 11. Here, in each liquid reservoir 14, the surface area increasing member 15 is provided. Therefore, a heating surface area is increased with the liquid coolants moving inside the surface area increasing members 15, so that the efficiency of heat exchange between the housing 11 and liquid coolants is improved and the cooling of the electronic components E is prompted. In addition, in a case where a member in which a microchannel is formed is used as each surface area increasing member 15, there is a difference between a pressure at a path inlet of the surface area increasing member 15 and a pressure at a path outlet of the surface area increasing member 15. Since coolant vapor is likely to be generated on the path outlet side at which a pressure is low, the cooling of the electronic component E is further prompted.

In addition, since each surface area increasing member 15 is provided in a state of being in contact with the rear surface 11b, the pair of side surfaces 14a and 14b, and the bottom surface 14c, it is possible to make the liquid coolant likely to be concentrated inside the surface area increasing member 15 and thus the cooling of the electronic component E is further prompted.

Note that, the liquid coolant receives the heat of the housing 11 via the surface area increasing member 15 and changes into coolant vapor. However, a portion of the liquid coolant is discharged from the liquid reservoir 14 (surface area increasing member 15) in a liquid state. A configuration in which the liquid reservoirs 14 positioned on the lower side are immersed in liquid coolants discharged from the liquid reservoirs 14 positioned on the upper side may also be adopted. In addition, in FIG. 3, the housing 11 and the bottom surface 14c abut onto each other. However, a configuration in which the housing 11 and the bottom surface 14c are disposed to be separated from each other and the liquid coolants discharged from the liquid reservoirs 14 adhere to a space between the housing 11 and the bottom surface 14c may also be adopted. In this case, the coolant vapor can be generated not only inside the liquid reservoirs 14 but also outside the liquid reservoirs 14.

As illustrated by an arrow A2 in FIG. 2, the coolant vapor flows upward in the housing 11 and is discharged to the first pipe 31. At this time, the coolant vapor generated in the liquid reservoirs 14 positioned on the lower side from among the liquid reservoirs 14 passes through grooves 12c and the gaps 16 between the liquid reservoirs 14 positioned on the upper side and flows upward.

The coolant vapor is supplied to the condenser 20 via the first pipe 31. The coolant vapor from the first pipe 31 is supplied to the fine pipes 22a through the vapor pipe 21 and flows through the fine pipe 22a. The coolant vapor is cooled and condensed (liquefied) when flowing through the fine pipes 22a. The coolant vapor discharges heat when flowing through the fine pipes 22a and the state thereof returns to a liquid state from a gaseous state. At this time, air blown from the fan 22b assists the cooling of the coolant vapor. The condensed liquid coolants flow downward in the fine pipes 22a and are discharged to the second pipe 32 through the condensing pipe 23. The liquid coolant returns to the evaporator 10 through the second pipe 32.

As described above, according to the present embodiment, the plurality of surface area increasing members 15 are provided respectively corresponding to the plurality of electronic components E and the liquid coolant moving in the surface area increasing member 15 cools the corresponding electronic component E. For example, even in a case where the plurality of electronic components E are disposed in a vertical posture, the plurality of electronic components E can be cooled independently of each other. As a result, the electronic components E can be cooled efficiently. In addition, since the heating surface area is increased due to the surface area increasing members 15, the efficiency of heat exchange between the electronic components E and the coolants which is performed via the evaporator 10 (attachment surface 11a of housing 11) is improved.

In addition, each surface area increasing member 15 has such a size that the surface area increasing member 15 can be provided for each electronic component E. Therefore, for example, even in a case where the surface area increasing member 15 in which a microchannel is formed is used, a pressure loss which occurs when a coolant moves in a plurality of paths of the microchannel is suppressed and thus it is possible to easily increase the flow rate of the coolant. In addition, due to an increase in flow rate of the coolant, an improvement in amount of heat transmission can be achieved.

In addition, according to the present embodiment, on the attachment surface 11a, the plurality of electronic components E are arranged in the horizontal direction and are attached in a plurality of rows in the vertical direction, and the first flow path 12 is provided for each of the rows of electronic components E and extends in the horizontal direction. Therefore, the liquid coolants from the first flow paths 12 can be reliably supplied to all of the plurality of surface area increasing members 15 which are provided corresponding to the plurality of electronic components E which are arranged in the horizontal direction and the vertical direction.

In addition, according to the present embodiment, the upper flow path 12a positioned on the upper side, which is one of the first flow paths 12 respectively provided for the rows of electronic components E, is provided with a groove (vapor passage portion) 12c through which coolant vapor generated on the lower side flows upward. Therefore, it is possible to prevent an upward movement of the coolant vapor generated on the lower side from being hindered by the upper flow path 12a.

Note that, the present invention is not limited to the embodiment described above with reference to the drawings and various modifications can be made within the technical scope of the present invention.

For example, in the above-described embodiment, a coolant of which the state changes from a liquid state to a gaseous state due to the heat of the electronic component E is adopted as the liquid coolant. However, the present invention is not limited thereto and a coolant that is used to cool the electronic component E in a liquid state may be used as the liquid coolant. In this case, the posture of the evaporator 10 (heat receiver) is not limited to a vertical posture and the posture of the evaporator 10 may be a horizontal posture or the like.

The plurality of electronic components E may be attached to the attachment surface 11a such that the electronic components E are arranged only in the horizontal direction or only in the vertical direction.

The vapor passage portion is not limited to the groove as long as the coolant vapor generated on the lower side can flow upward therethrough. For example, the vapor passage portion may be formed by providing a gap between the upper flow path 12a and the inner surface of the housing 11.

In addition, without departing from the spirit of the present invention, the components in the embodiment may be properly replaced by well-known components, and the above-described modification examples may be appropriately combined with each other.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES 1 cooling device, 10 evaporator (heat receiver), 11a attachment surface, 12 first flow path, 12c groove (vapor passage portion), 14 liquid reservoir, 15 surface area increasing member, 20 condenser (heat discharger), 30 circulation flow path

What is claimed is:

1. A cooling device comprising:
a heat receiver that receives heat of an electronic component via a coolant;
a heat discharger that discharges heat of the coolant from the heat receiver;
a first pipe connected to the heat received and the heat discharger, and through which the coolant flows from the heat receiver to the heat discharger; and
a second pipe through which the coolant flows from the heat discharger to the heat receiver,
wherein the heat receiver is provided with
a housing;
an attachment surface to which a plurality of the electronic components are attached,
a first flow path that communicates with the second pipe,
a plurality of liquid reservoirs that communicate with the first flow path and that are provided on a rear surface of the attachment surface corresponding to the plurality of electronic components, and
surface area increasing members that are provided in the liquid reservoirs,
wherein each of the liquid reservoirs includes a pair of side surfaces and a bottom surface, and is configured to be able to store the coolant, and
wherein the first flow path is directly connected to each inlet of the liquid reservoirs, and a coolant vapor is output from each outlet of the liquid reservoirs and entered in an entire cavity with the housing before being exhausted from the first pipe.

2. The cooling device according to claim 1,
wherein the heat receiver is an evaporator that evaporates the coolant in a liquid state by using the heat of the electronic component,
wherein the heat discharger is a condenser that condenses coolant vapor generated in the evaporator to reproduce a liquid coolant, and
wherein the evaporator is provided in a vertical posture.

3. The cooling device according to claim 2,
wherein the plurality of electronic components are attached to the attachment surface such that the electronic components are arranged in a horizontal direction, and
wherein the first flow path extends in the horizontal direction.

4. The cooling device according to claim 3,
wherein the plurality of electronic components arranged in the horizontal direction are attached to the attachment surface in a plurality of rows in a vertical direction, and
wherein the first flow path is provided for each of the rows of electronic components.

5. The cooling device according to claim 4,
wherein the first flow path positioned on an upper side from among first flow paths respectively provided for the rows of electronic components is provided with a vapor passage portion through which the coolant vapor generated on a lower side flows upward.

* * * * *